(12) United States Patent
Trasporto et al.

(10) Patent No.: US 7,919,850 B2
(45) Date of Patent: Apr. 5, 2011

(54) INTEGRATED CIRCUIT PACKAGING SYSTEM WITH EXPOSED TERMINAL INTERCONNECTS AND METHOD OF MANUFACTURING THEREOF

(75) Inventors: Arnel Senosa Trasporto, Singapore (SG); Lionel Chien Hui Tay, Singapore (SG); Zigmund Ramirez Camacho, Singapore (SG); Abelardo Hadap Advincula, Jr., Singapore (SG)

(73) Assignee: Stats Chippac Ltd., Singapore (SG)

( * ) Notice: Subject to any disclaimer, the term of this patent is extended or adjusted under 35 U.S.C. 154(b) by 235 days.

(21) Appl. No.: 12/331,416

(22) Filed: Dec. 9, 2008

(65) Prior Publication Data
US 2010/0140789 A1 Jun. 10, 2010

(51) Int. Cl.
*H01L 23/04* (2006.01)
*H01L 23/02* (2006.01)

(52) U.S. Cl. ........ 257/698; 257/666; 257/673; 257/685; 257/686; 257/E25.006; 257/E25.013; 257/E25.021; 257/E25.027; 257/E23.085; 438/109; 438/123

(58) Field of Classification Search .......... 257/666–676, 257/686, 693, E25.006, E25.013, E25.021, 257/E25.027, E23.085; 438/109
See application file for complete search history.

(56) References Cited

U.S. PATENT DOCUMENTS

| | | | |
|---|---|---|---|
| 6,791,168 B1 * | 9/2004 | Connell et al. | 257/668 |
| 6,906,416 B2 | 6/2005 | Karnezos | |
| 7,064,426 B2 | 6/2006 | Karnezos | |
| 7,193,309 B2 * | 3/2007 | Huang et al. | 257/686 |
| 7,435,619 B2 | 10/2008 | Shim et al. | |
| 7,642,633 B2 * | 1/2010 | Hirose et al. | 257/686 |
| 7,750,451 B2 * | 7/2010 | Camacho et al. | 257/686 |
| 2007/0114648 A1 * | 5/2007 | Karnezos | 257/686 |
| 2007/0200205 A1 * | 8/2007 | Filoteo et al. | 257/666 |
| 2008/0157325 A1 * | 7/2008 | Chow et al. | 257/686 |

* cited by examiner

*Primary Examiner* — Jasmine J Clark
(74) *Attorney, Agent, or Firm* — Mikio Ishimaru

(57) ABSTRACT

A method of manufacture of an integrated circuit packaging system includes: providing a lead; mounting an inner package so that the lead is peripheral to the inner package, and the inner package having a connection pad; forming an exposed terminal interconnect on the connection pad; and encapsulating the inner package, and partially encapsulating the exposed terminal interconnect with an encapsulation.

20 Claims, 7 Drawing Sheets

INTEGRATED CIRCUIT PACKAGING SYSTEM WITH EXPOSED TERMINAL INTERCONNECTS AND METHOD OF MANUFACTURING THEREOF

TECHNICAL FIELD

The present invention relates generally to an integrated circuit packaging system and more particularly to a system for utilizing exposed terminal interconnects in an integrated circuit packaging system.

BACKGROUND ART

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a lead; mounting an inner package so that the lead is peripheral to the inner package, and the inner package having a connection pad; forming an exposed terminal interconnect on the connection pad; and encapsulating the inner package, and partially encapsulating the exposed terminal interconnect with an encapsulation.

The present invention provides an integrated circuit packaging system including: a lead; an inner package having a connection pad mounted so that the lead is peripheral to the inner package; an exposed terminal interconnect formed on the connection pad; and an encapsulation that encapsulates the inner package, and partially encapsulates the exposed terminal interconnect.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
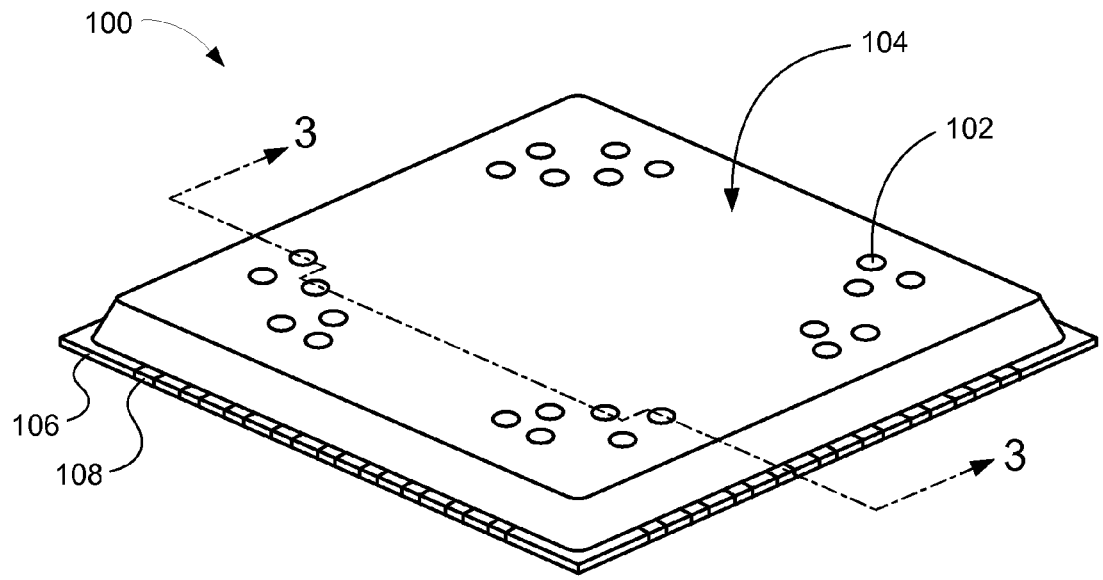
FIG. 1 is an isometric view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

For expository purposes, the term "horizontal" as used herein is defined as a plane parallel to the plane or surface of the first integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown an isometric view of an integrated circuit packaging system 100 such as a dual row integrated circuit packaging system in an embodiment of the present invention. The integrated circuit packaging system 100 is shown having exposed terminal interconnects 102 such as solder balls exposed from an encapsulation 104. The encapsulation 104 such as a film assisted molding, has an edge 106. Exposed from the edge 106 of the encapsulation 104 are leads 108.

Figure 2:
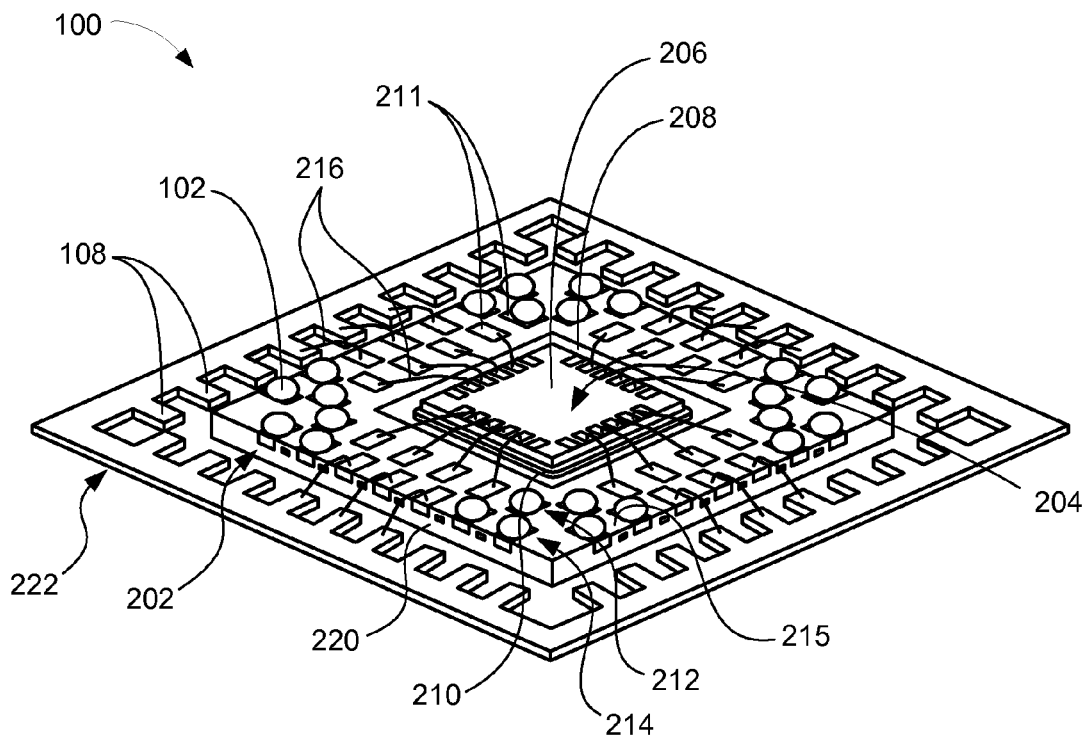
FIG. 2 is the integrated circuit packaging system of FIG. 1 in a pre-encapsulation phase of manufacture.

Referring now to FIG. 2, therein is shown the integrated circuit packaging system 100 of FIG. 1 in a pre-encapsulation phase of manufacture. The integrated circuit packaging system 100 is shown having an inner package 202 such as a dual row inner package. The inner package 202 may be a known good die, increasing end line yield.

The inner package 202 has a first integrated circuit die 204 such as a wire-bonded die with an active side 206 mounted to an inner package die-pad 208 with a die attach adhesive 210. Peripheral to the inner package die-pad 208 are connection pads 211 such as first row connection pads 212 and second row connection pads 214 on a first surface 215.

The active side 206 of the first integrated circuit die 204 is connected to the first row connection pads 212 with interconnects 216 such as bond wires. The first row connection pads 212 are arranged peripheral to the first integrated circuit die 204.

The second row connection pads 214 are generally arranged peripheral to the first row connection pads 212 and to the first integrated circuit die 204. The exposed terminal interconnects 102 may be mounted to the second row connection pads 214 and the first row connection pads 212. The exposed terminal interconnects 102 may be lead-tin solder balls or copper pillars. Below the inner package die-pad 208 is an inner package encapsulation 220. Peripheral to the inner package 202 is a base lead-frame 222 with the leads 108. The leads 108 of the base lead-frame 222 are connected to the second row connection pads 214 with the interconnects 216.

Figure 3:
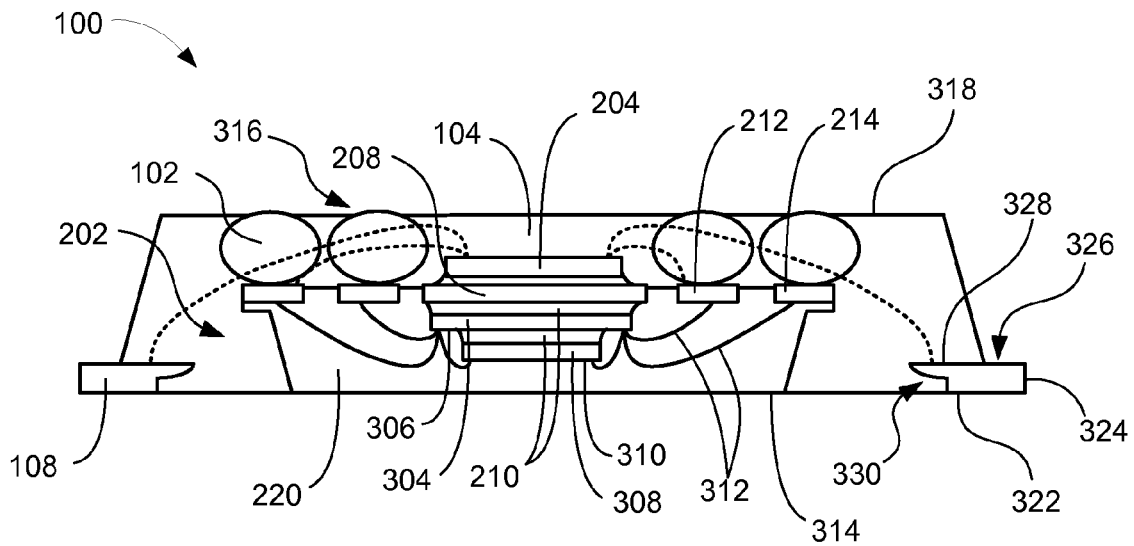
FIG. 3 is a cross-sectional view of the integrated circuit packaging system along the line 3-3 of FIG. 1.

Referring now to FIG. 3, therein is shown a cross-sectional view of the integrated circuit packaging system 100 along the line 3-3 of FIG. 1. The integrated circuit packaging system 100 is shown having the inner package 202 partially encapsulated by the encapsulation 104.

The encapsulation 104, such as film assisted molding, protects sensitive components from moisture, dust and other contamination.

In greater detail the inner package 202 is shown having a second integrated circuit die 304 such as a first inner package wire-bonded die with an active side 306. Mounted below the second integrated circuit die 304 is a third integrated circuit die 308 such as a second inner package wire-bonded die with an active side 310.

The active side 310 of the third integrated circuit die 308 is connected to the active side 306 of the second integrated circuit die 304 with inner package interconnects 312 such as bond wires. The active side 306 of the second integrated circuit die 304 is connected to the first row connection pads 212 and the second row connection pads 214 with the inner package interconnects 312. The third integrated circuit die 308 is attached to the second integrated circuit die 304 with the die attach adhesive 210. The second integrated circuit die 304 is attached below the inner package die-pad 208 with the die attach adhesive 210.

The second integrated circuit die 304 and the third integrated circuit die 308 are shown encapsulated by the inner package encapsulation 220. The inner package encapsulation 220 is partially encapsulated by the encapsulation 104 but has an exposed bottom surface 314 which is exposed from the encapsulation 104.

The exposed terminal interconnects 102 connected to the first row connection pads 212 and the second row connection pads 214 are also only partially encapsulated by the encapsulation 104. Partially encapsulating the exposed terminal interconnects 102 creates a bulged exposed surface 316 that bulges higher than a top surface 318 of the encapsulation 104.

The encapsulation 104 also partially encapsulates the leads 108. The leads 108 are mounted peripheral to the inner package 202. The leads are exposed from the encapsulation on a bottom side 322, on a side 324 and on a portion 326 of a top side 328.

The lead 108 is half etched to form a notch 330 helping to secure the lead 108 in the encapsulation 104 and providing greater structural rigidity. It has been discovered that the multiple I/O ports such as the leads 108 and the exposed terminal interconnects 102 provide a higher density signal capability without increasing the size of the integrated circuit packaging system 100 and without decreasing the size I/O ports. This allows existing factories to produce more sophisticated products without expensive retooling.

Figure 4:
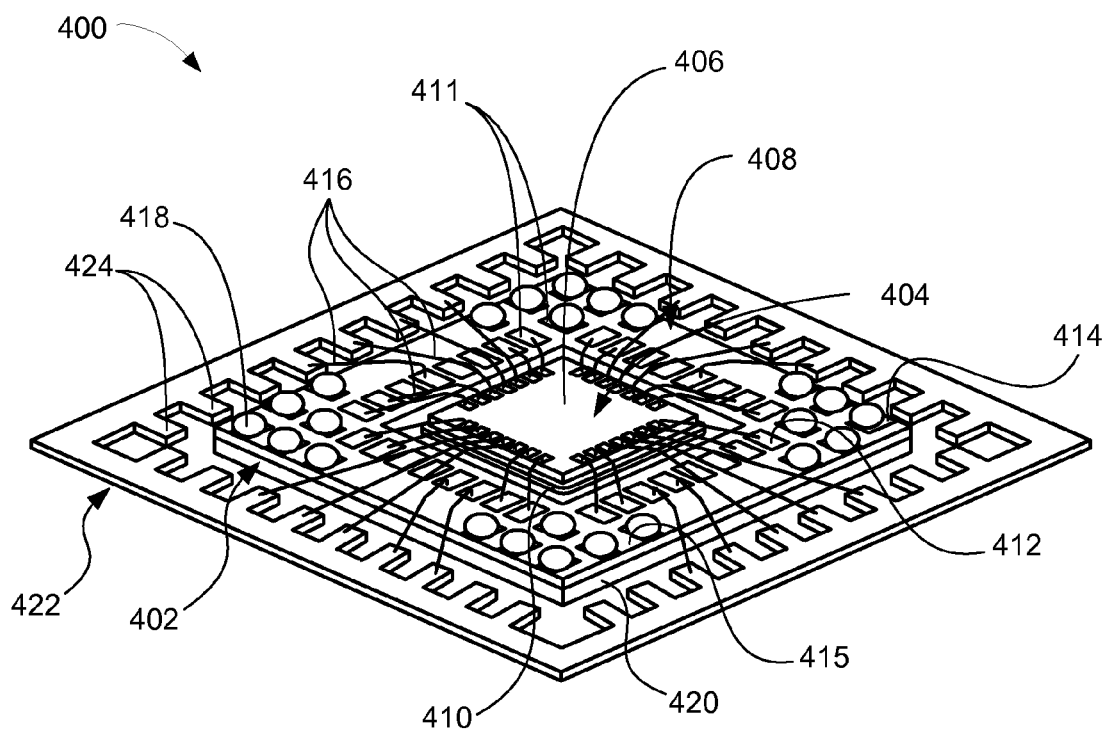
FIG. 4 is an isometric view of an integrated circuit packaging system in a further embodiment of the present invention, and in a pre-encapsulation phase of manufacture.

Referring now to FIG. 4, therein is shown an isometric view of an integrated circuit packaging system 400 such as a selectively balled integrated circuit packaging system in a further embodiment of the present invention, and in a pre-encapsulation phase of manufacture. The integrated circuit packaging system 400 is shown having an inner package 402 such as a selectively balled inner package. The inner package 402 may be a known good die, increasing end line yield.

The inner package 402 has a first integrated circuit die 404 such as a wire-bonded die with an active side 406 mounted to a substrate 408 such as a laminated plastic or ceramic substrate with a die attach adhesive 410. The substrate 408 has connection pads 411 such as wire-bond connection pads 412 and exposed terminal interconnect connection pads 414 on a first surface 415 of the substrate 408.

The active side 406 of the first integrated circuit die 404 is connected to the wire-bond connection pads 412 with interconnects 416 such as bond wires. The wire-bond connection pads 412 are arranged peripheral to the first integrated circuit die 404.

The exposed terminal interconnect connection pads 414 are generally arranged peripheral wire-bond connection pads 412 but may be selectively placed on the substrate 408 to provide application specific integration into a broader electronic system.

Mounted to the exposed terminal interconnect connection pads 414 are exposed terminal interconnects 418 such as lead-tin solder balls or copper pillars. Below the substrate 408 is an inner package encapsulation 420. Peripheral to the inner package 402 is a base lead-frame 422 with leads 424. The leads 424 of the base lead-frame 422 are connected to the active side 406 of the first integrated circuit die 404 with the interconnects 416. The leads 424 are also connected to the wire-bond connection pads 412 with the interconnects 416.

Figure 5:
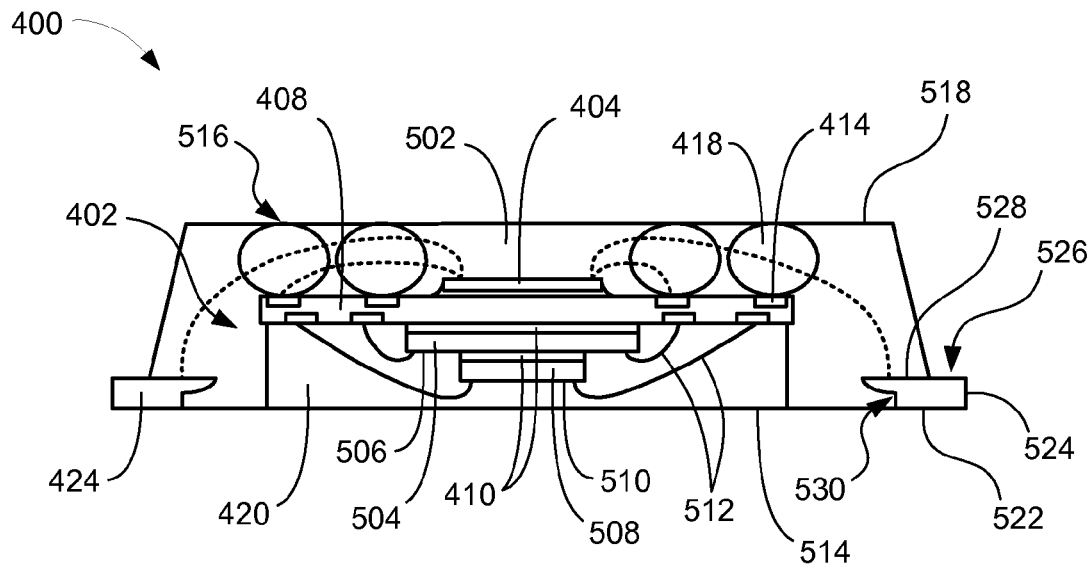
FIG. 5 is a cross-sectional view of the integrated circuit packaging system of FIG. 4 after a singulation phase of manufacture.

Referring now to FIG. 5, therein is shown a cross-sectional view of the integrated circuit packaging system 400 of FIG. 4 after a singulation phase of manufacture. The integrated circuit packaging system 400 is shown having the inner package 402 partially encapsulated by an encapsulation 502.

The encapsulation 502, such as film assisted molding, protects sensitive components from moisture, dust and other contamination.

In greater detail the inner package 402 is shown having a second integrated circuit die 504 such as a first inner package wire-bonded die with an active side 506. Mounted below the second integrated circuit die 504 is a third integrated circuit die 508 such as a second inner package wire-bonded die with an active side 510.

The active side 510 of the third integrated circuit die 508 and the active side 506 of the second integrated circuit die 504 are connected to the substrate 408 with inner package interconnects 512 such as bond wires. The third integrated circuit die 508 is attached to the second integrated circuit die 504 with the die attach adhesive 410. The second integrated circuit die 504 is attached below the substrate 408 with the die attach adhesive 410.

The second integrated circuit die 504 and the third integrated circuit die 508 are shown encapsulated by the inner package encapsulation 420. The inner package encapsulation 420 is partially encapsulated by the encapsulation 502 but has an exposed bottom surface 514 which is exposed from the encapsulation 502.

The exposed terminal interconnects 418 connected to the exposed terminal interconnect connection pads 414 on the substrate 408 are also only partially encapsulated by the encapsulation 502. Partially encapsulating the exposed terminal interconnects 418 creates a level exposed surface 516 that is level with a top surface 518 of the encapsulation 502.

The encapsulation 502 also partially encapsulates the leads 424. The leads 424 are mounted peripheral to the inner package 402. The leads are exposed from the encapsulation on a bottom side 522, on a side 524 and on a portion 526 of a top side 528.

The lead 424 is half etched to form a notch 530 helping to secure the lead 424 in the encapsulation 502 and providing greater structural rigidity. It has been discovered that the multiple I/O ports such as the leads 424 and the exposed terminal interconnects 418 provide a higher density signal capability without increasing the size of the integrated circuit packaging system 400 and without decreasing the size I/O ports. This allows existing factories to produce more sophisticated products without expensive retooling.

Figure 6:
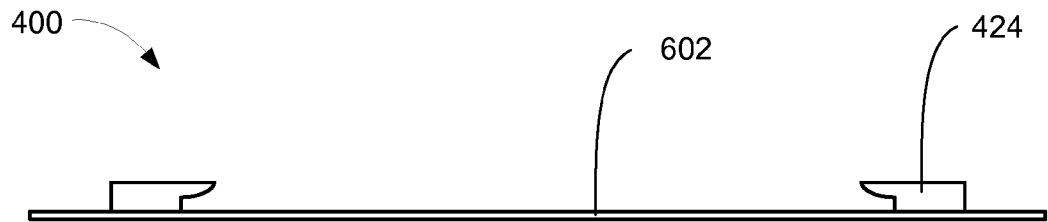
FIG. 6 is the integrated circuit packaging system of FIG. 5 after a lead-frame providing phase of manufacture.

Referring now to FIG. 6, therein is shown the integrated circuit packaging system 400 of FIG. 5 after a lead-frame providing phase of manufacture. The integrated circuit packaging system 400 is shown having a coverlay tape 602 with the base lead-frame 422 mounted above.

Figure 7:
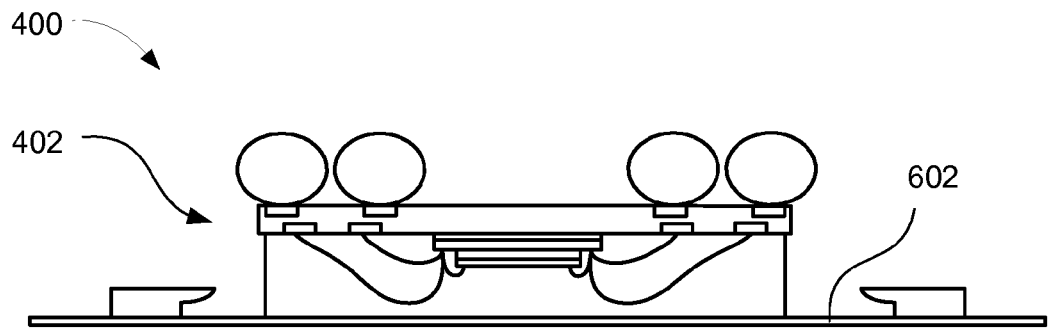
FIG. 7 is the integrated circuit packaging system of FIG. 5 after an inner package mounting phase of manufacture.

Referring now to FIG. 7, therein is shown the integrated circuit packaging system 400 of FIG. 5 after an inner package mounting phase of manufacture. The integrated circuit packaging system 400 is shown having the inner package 402 mounted above the coverlay tape 602. The inner package 402 should have been tested prior to mounting and determined to be a known good package.

Figure 8:
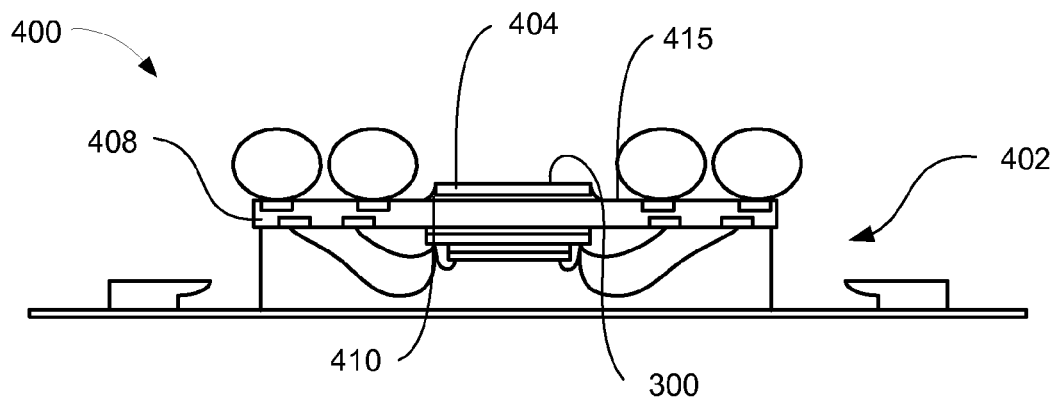
FIG. 8 is the integrated circuit packaging system of FIG. 5 after an integrated circuit mounting phase of manufacture.

Referring now to FIG. 8, therein is shown the integrated circuit packaging system 400 of FIG. 5 after an integrated circuit mounting phase of manufacture. The integrated circuit packaging system 400 is shown having the first integrated circuit die 404 attached to the first surface 415 of the substrate 408 with the die attach adhesive 410.

Figure 9:
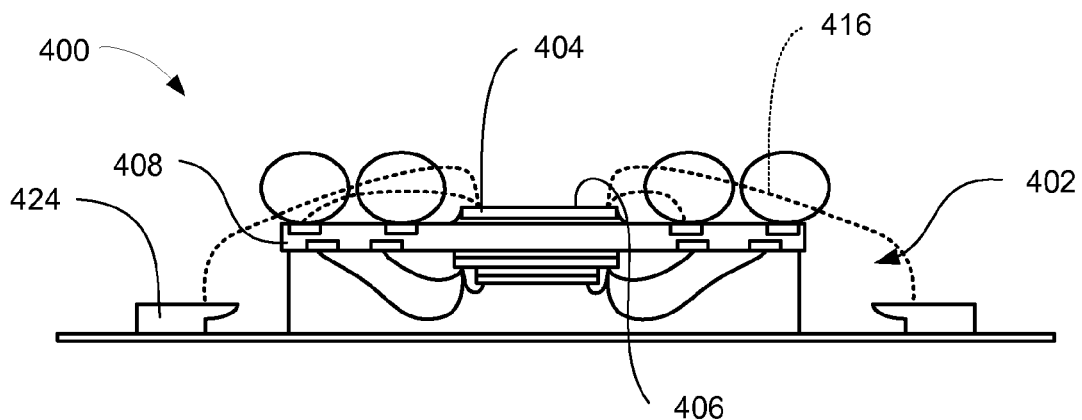
FIG. 9 is the integrated circuit packaging system of FIG. 5 after a wire-bonding phase of manufacture.

Referring now to FIG. 9, therein is shown the integrated circuit packaging system 400 of FIG. 5 after a wire-bonding phase of manufacture. The integrated circuit packaging system 400 is shown having the leads 424 connected to the active side 406 of the first integrated circuit die 404 with the interconnects 416.

Figure 10:
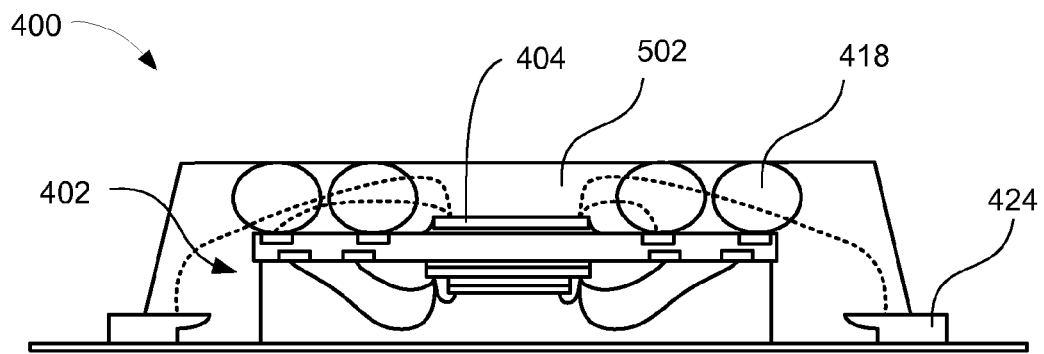
FIG. 10 is the integrated circuit packaging system of FIG. 5 after a molding phase of manufacture.

Referring now to FIG. 10, therein is shown the integrated circuit packaging system 400 of FIG. 5 after a molding phase of manufacture. The integrated circuit packaging system 400 is shown having the encapsulation 502 partially encapsulating the leads 424, the exposed terminal interconnects 418, and the inner package 402. The encapsulation 502 is also shown fully encapsulating the first integrated circuit die 404.

Figure 11:
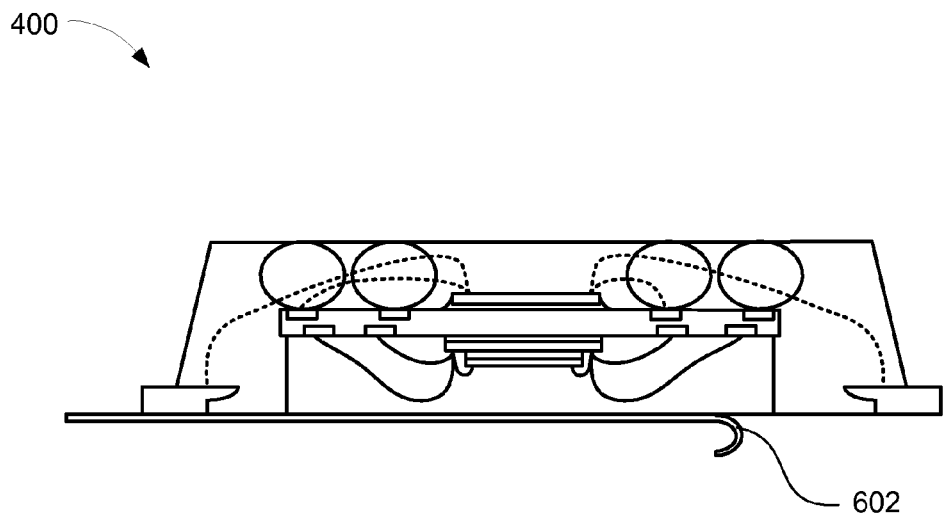
FIG. 11 is the integrated circuit packaging system of FIG. 5 in a coverlay tape removal phase of manufacture.

Referring now to FIG. 11, therein is shown the integrated circuit packaging system 400 of FIG. 5 in a coverlay tape removal phase of manufacture. The integrated circuit packaging system 400 is shown having the coverlay tape 602 removed from the integrated circuit packaging system 400.

Figure 12:
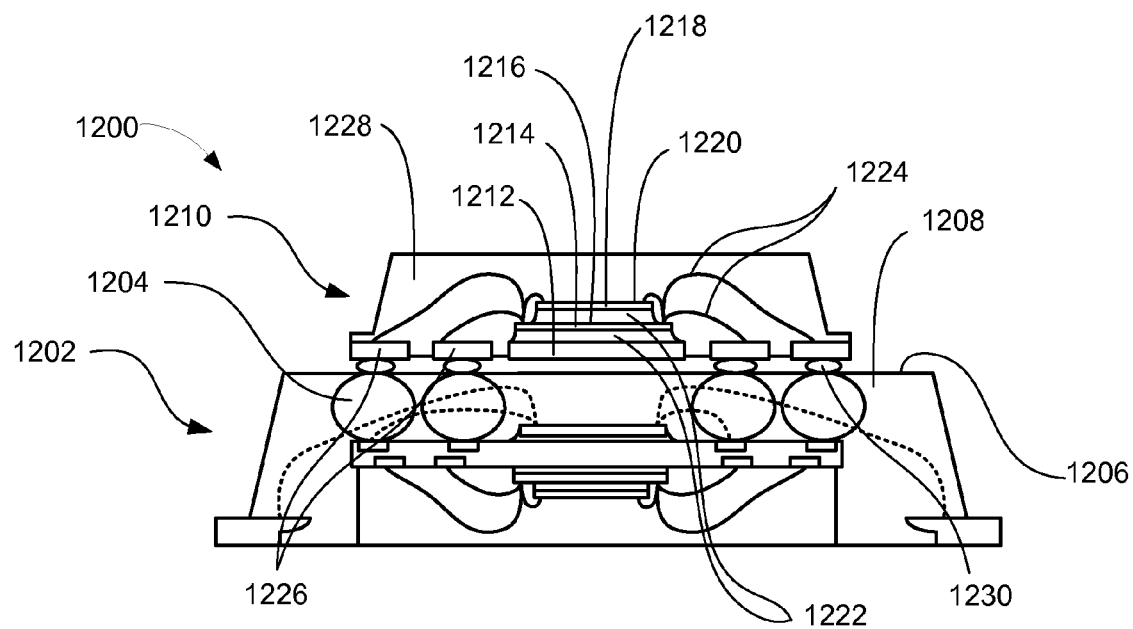
FIG. 12 is a cross-sectional view of an integrated circuit packaging system in a further embodiment of the present invention.

Referring now to FIG. 12, therein is shown a cross-sectional view of an integrated circuit packaging system 1200 in a further embodiment of the present invention. The integrated circuit packaging system 1200 is shown having a selectively balled integrated circuit packaging system 1202.

The selectively balled integrated circuit packaging system 1202 has exposed terminal interconnects 1204 exposed from a top surface 1206 of an encapsulation 1208. Mounted above the selectively balled integrated circuit packaging system 1202 is an external integrated circuit package 1210.

The external integrated circuit package 1210 has an external integrated circuit package die-pad 1212. Mounted above the external integrated circuit package die-pad is a first external integrated circuit package die 1214 such as a wire-bonded die with an active side 1216. Mounted above the first external integrated circuit package die 1214 is a second external integrated circuit package die 1218 such as a wire-bonded die with an active side 1220.

The second external integrated circuit package die 1218 is attached to the active side 1216 of the first external integrated circuit package die 1214 with a die attach adhesive 1222. The first external integrated circuit package die 1214 is attached to the external integrated circuit package die-pad 1212 with the die attach adhesive 1222.

The active side 1220 of the second external integrated circuit package die 1218 is connected to the active side 1216 of the first external integrated circuit package die 1214 with external integrated circuit package interconnects 1224 such as bond wires.

The active side 1216 of the first external integrated circuit package die 1214 is connected to external integrated circuit package connection pads 1226 with the external integrated circuit package interconnects 1224.

The first external integrated circuit package die 1214 and the second external integrated circuit package die 1218 are encapsulated by an external integrated circuit package encapsulation 1228 such as a film assisted molding. The external integrated circuit package connection pads 1226 are connected to the exposed terminal interconnects 1204 of the selectively balled integrated circuit packaging system 1202 with solder bumps 1230.

Figure 13:
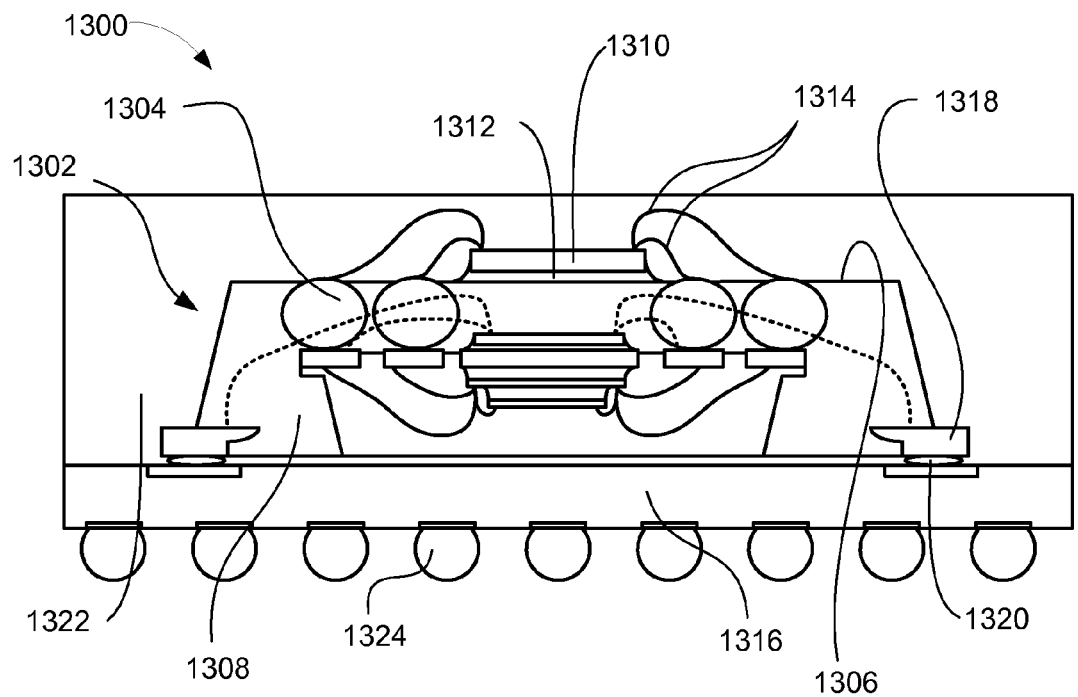
FIG. 13 is a cross-sectional view of an integrated circuit packaging system in a further embodiment of the present invention.

Referring now to FIG. 13, therein is shown a cross-sectional view of an integrated circuit packaging system 1300 in a further embodiment of the present invention. The integrated circuit packaging system 1300 is shown having a dual row integrated circuit packaging system 1302.

The dual row integrated circuit packaging system 1302 has exposed terminal interconnects 1304 exposed from a top surface 1306 of an encapsulation 1308. Mounted above the dual row integrated circuit packaging system 1302 is an external integrated circuit package 1310.

The external integrated circuit package 1310 has an external integrated circuit package die-pad 1312. The external integrated circuit package 1310 is attached to the top surface 1306 of the dual row integrated circuit packaging system 1302 with a die attach adhesive 1312.

The external integrated circuit package 1310 is connected to the exposed terminal interconnects 1304 with an external integrated circuit package interconnects 1314 such as bond wires. The dual row integrated circuit packaging system 1302 is mounted above a base substrate 1316. Leads 1318 on the dual row integrated circuit packaging system 1302 are connected to the base substrate 1316 by solder bumps 1320.

The dual row integrated circuit packaging system 1302 and the external integrated circuit package 1310 are encapsulated by an exterior encapsulation 1322 such as a film assisted molding. Below the base substrate 1316 external interconnects 1324 such as solder balls are mounted.

Figure 14:
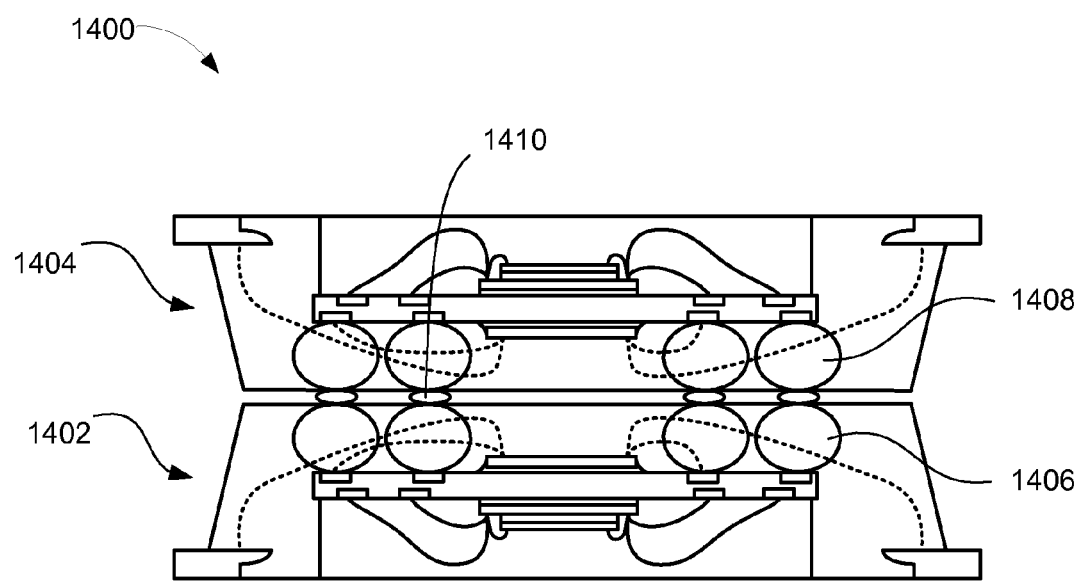
FIG. 14 is a cross-sectional view of an integrated circuit packaging system in a further embodiment of the present invention.

Referring now to FIG. 14, therein is shown a cross-sectional view of an integrated circuit packaging system 1400 in a further embodiment of the present invention. The integrated circuit packaging system 1400 is shown having a first selectively balled integrated circuit packaging system 1402 mounted to a second selectively balled integrated circuit packaging system 1404 that has been inverted so that exposed terminal interconnects 1406 from the first selectively balled integrated circuit packaging system 1402 and exposed terminal interconnects 1408 such as solder balls from the second selectively balled integrated circuit packaging system 1404 are aligned and connected with solder interconnects 1410.

Figure 15:
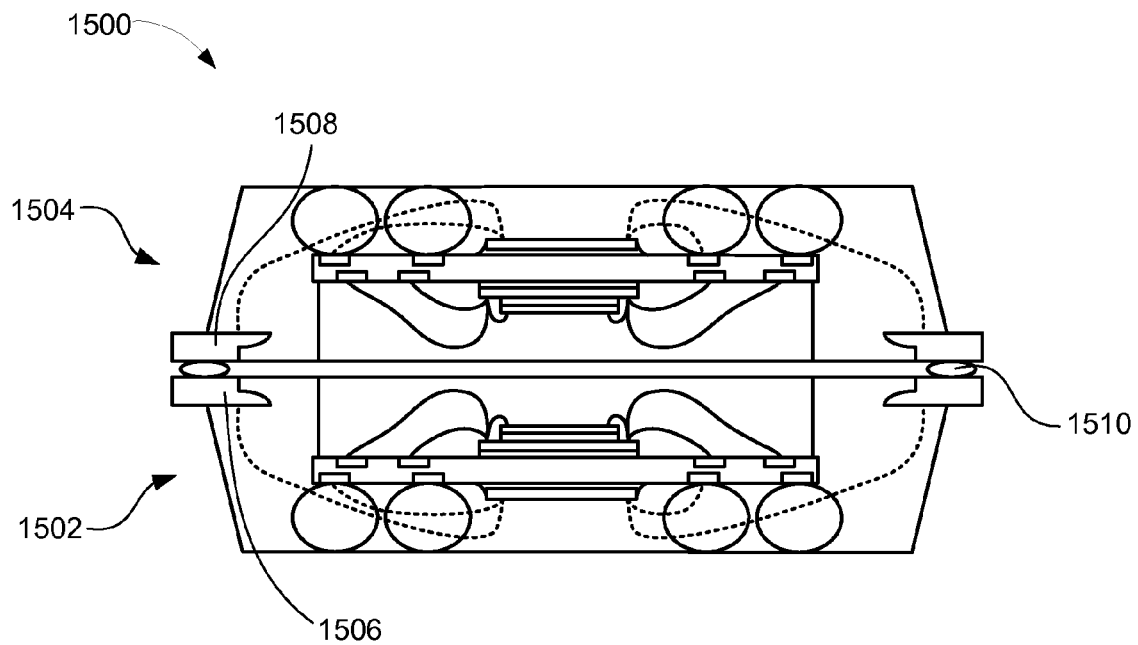
FIG. 15 is a cross-sectional view of an integrated circuit packaging system in a further embodiment of the present invention.

Referring now to FIG. 15, therein is shown a cross-sectional view of an integrated circuit packaging system 1500 in a further embodiment of the present invention. The integrated circuit packaging system 1500 is shown having a first selectively balled integrated circuit packaging system 1502 mounted to a second selectively balled integrated circuit packaging system 1504 that has been inverted so that leads 1506 from the first selectively balled integrated circuit packaging system 1502 and leads 1508 from the second selectively balled integrated circuit packaging system 1504 are aligned and connected with solder interconnects 1510.

Figure 16:
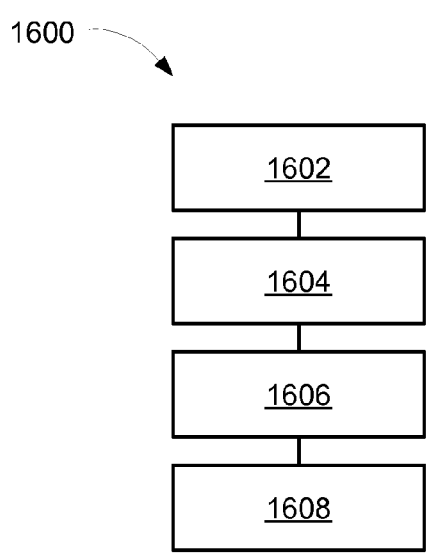
FIG. 16 is a flow chart of a method of manufacture of an integrated circuit packaging system in a further embodiment of the present invention.

Referring now to FIG. 16, therein is shown a flow chart of a method 1600 of manufacture of an integrated circuit packaging system 100 of FIG. 1 in a further embodiment of the present invention. The method 1600 includes providing a lead in a block 1602; mounting an inner package so that the lead is peripheral to the inner package, and the inner package having a connection pad in a block 1604; forming an exposed terminal interconnect on the connection pad in a block 1606; and encapsulating the inner package, and partially encapsulating the exposed terminal interconnect with an encapsulation in a block 1608.

Thus, it has been discovered that the exposed terminal interconnects of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a lead;
   mounting an inner package so that the lead is peripheral to the inner package, and the inner package having a connection pad;
   forming an exposed terminal interconnect on the connection pad; and
   encapsulating the inner package, and partially encapsulating the exposed terminal interconnect with an encapsulation.

2. The method as claimed in claim 1 further comprising:
   mounting a first integrated circuit die above the inner package; and
   connecting the first integrated circuit die to the lead or the connection pad with an interconnect.

3. The method as claimed in claim 1 wherein:
   providing the lead includes providing a base lead-frame;
   mounting the base lead-frame on a coverlay tape;

further comprising:
  removing the coverlay tape; and
  singulating the base lead-frame from the lead.
4. The method as claimed in claim 1 wherein:
  partially encapsulating the exposed terminal interconnect includes exposing a level exposed surface, a bulged exposed surface, or a combination thereof.
5. The method as claimed in claim 1 further comprising:
  mounting an external integrated circuit package above the encapsulation; and
  connecting the external integrated circuit package to the exposed terminal interconnects with a solder bump, a bond wire or a combination thereof.
6. A method of manufacture of an integrated circuit packaging system comprising:
  providing a lead;
  mounting a dual row inner package or a selectively balled inner package so that the lead is peripheral to the inner package, and the inner package having a connection pad;
  forming an exposed terminal interconnect on the connection pad; and
  encapsulating the inner package, and partially encapsulating the exposed terminal interconnect with an encapsulation to create a first selectively balled integrated circuit packaging system or a first dual row integrated circuit packaging system.
7. The method as claimed in claim 6 wherein:
  mounting the dual row inner package includes mounting a dual row inner package having an inner package die-pad, and the connection pad is a first row connection pad or a second row connection pad.
8. The method as claimed in claim 6 wherein:
  mounting the selectively balled inner package includes mounting a selectively balled inner package having a substrate, and the connection pad is a wire-bond connection pad or an exposed terminal interconnect connection pads.
9. The method as claimed in claim 6 further comprising:
  mounting a second selectively balled integrated circuit packaging system above the first selectively balled integrated circuit packaging system; and
  connecting the exposed terminal interconnect or the lead of the first selectively balled integrated circuit packaging system to an exposed terminal interconnect or a lead of the second selectively balled integrated circuit packaging system.
10. The method as claimed in claim 6 wherein:
  connecting the dual row inner package or the selectively balled inner package to the lead with an interconnect.
11. An integrated circuit packaging system comprising:
  a lead;
  an inner package having a connection pad mounted so that the lead is peripheral to the inner package;
  an exposed terminal interconnect formed on the connection pad; and
  an encapsulation that encapsulates the inner package, and partially encapsulates the exposed terminal interconnect.
12. The system as claimed in claim 11 further comprising:
  a first integrated circuit die mounted above the inner package; and
  an interconnect that connects the first integrated circuit die to the lead or the connection pad.
13. The system as claimed in claim 11 further comprising:
  an external integrated circuit package mounted above the encapsulation;
  a base substrate mounted below the lead; and
  an exterior encapsulation that encapsulates the external integrated circuit package and the encapsulation.
14. The system as claimed in claim 11 further comprising:
  a level exposed surface, a bulged exposed surface, or a combination thereof exposed from the encapsulation on the exposed terminal interconnect.
15. The system as claimed in claim 11 further comprising:
  an external integrated circuit package mounted above the encapsulation; and
  a solder bump, a bond wire or a combination thereof that connects the external integrated circuit package to the exposed terminal interconnects.
16. The system as claimed in claim 11 wherein:
  the inner package is a dual row inner package or a selectively balled inner package that creates a first selectively balled integrated circuit packaging system or a first dual row integrated circuit packaging system.
17. The system as claimed in claim 16 wherein:
  the dual row inner package has an inner package die-pad, and the connection pad is a first row connection pad or a second row connection pad.
18. The system as claimed in claim 16 wherein:
  the selectively balled inner package has a substrate, and the connection pad is a wire-bond connection pad or an exposed terminal interconnect connection pads.
19. The system as claimed in claim 16 further comprising:
  a second selectively balled integrated circuit packaging system mounted above the first selectively balled integrated circuit packaging system; and
  a solder interconnect that connects the exposed terminal interconnect or the lead of the first selectively balled integrated circuit packaging system to an exposed terminal interconnect or a lead of the second selectively balled integrated circuit packaging system.
20. The system as claimed in claim 16 wherein:
  the dual row inner package or the selectively balled inner package is connected to the lead with an interconnect.

* * * * *

UNITED STATES PATENT AND TRADEMARK OFFICE
CERTIFICATE OF CORRECTION

PATENT NO.         : 7,919,850 B2                                               Page 1 of 1
APPLICATION NO.    : 12/331416
DATED              : April 5, 2011
INVENTOR(S)        : Trasporto et al.

It is certified that error appears in the above-identified patent and that said Letters Patent is hereby corrected as shown below:

<u>Title page, INID (75) Inventors</u>:
        delete "Abelardo Hadap Advincula, Jr.," and insert therefor --Abelardo Jr. Hadap Advincula,--

Signed and Sealed this
Fourteenth Day of June, 2011

David J. Kappos
*Director of the United States Patent and Trademark Office*